(12) United States Patent
Hosoyamada et al.

(10) Patent No.: US 7,361,980 B2
(45) Date of Patent: Apr. 22, 2008

(54) SEMICONDUCTOR DEVICE

(75) Inventors: Sumikazu Hosoyamada, Kawasaki (JP); Kazuto Tsuji, Kawasaki (JP); Yoshihiro Kubota, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 526 days.

(21) Appl. No.: 11/137,697

(22) Filed: May 26, 2005

(65) Prior Publication Data

US 2005/0280034 A1   Dec. 22, 2005

(30) Foreign Application Priority Data

Jun. 2, 2004   (JP) ............................. 2004-164857

(51) Int. Cl.
   *H01L 23/02*   (2006.01)
(52) U.S. Cl. ...................... 257/678; 257/758
(58) Field of Classification Search ................ 257/678, 257/698, 758
   See application file for complete search history.

(56) References Cited

U.S. PATENT DOCUMENTS 5,229,639 A * 7/1993 Hansen et al. .............. 257/666
6,025,616 A * 2/2000 Nguyen et al. ............. 257/207
6,890,794 B2 * 5/2005 Rotem ......................... 438/108
7,249,336 B2 * 7/2007 Nagata et al. ................ 716/13

FOREIGN PATENT DOCUMENTS

JP   64-89447   4/1989
JP   3-8360     1/1991

* cited by examiner

*Primary Examiner*—Roy Potter
(74) *Attorney, Agent, or Firm*—Westernman, Hattori, Daniels & Adrian, LLP.

(57) ABSTRACT

A semiconductor device comprises a semiconductor chip in which a circuit part provided in a center of the semiconductor chip is connected with power-supply lines and power-supply electrodes to supply power from an external power source to the circuit part. A substrate is provided for carrying the semiconductor chip thereon and provided so that first terminals in a region encircling the semiconductor chip are electrically connected to the power-supply electrodes. A first opening is formed on the power-supply line in a center of the circuit part. A second opening is formed on the power-supply line at a peripheral part of the circuit part. A conductor layer is electrically connected to second terminals in the region encircling the semiconductor chip on the substrate, and provided so that the power-supply line in the first opening and the power-supply line in the second opening are connected together.

9 Claims, 10 Drawing Sheets

SEMICONDUCTOR DEVICE

CROSS-REFERENCE TO RELATED APPLICATION

This application is based upon and claims the benefit of priority of Japanese Patent Application No. 2004-164857, filed on Jun. 2, 2004, the entire contents of which are herein incorporated by reference.

BACKGROUND OF THE INVENTION

1. Field of the Invention

The present invention generally relates to a semiconductor device, and more particularly relates to a semiconductor device which has the power supply wiring to supply power to a circuit part of a semiconductor chip via a power-supply line of the semiconductor chip.

2. Description of the Related Art

Conventionally, in the semiconductor device in which the semiconductor chip is mounted using the wire bonding method, the electrode at the peripheral part of the semiconductor chip carried on the substrate and the bonding lead on the substrate are electrically connected together by a wire etc.

At the time of operation, the power supply current is supplied from the electrode of the peripheral part of the semiconductor chip to the circuit part in the center of the semiconductor chip through the power-supply line.

Figure 1:
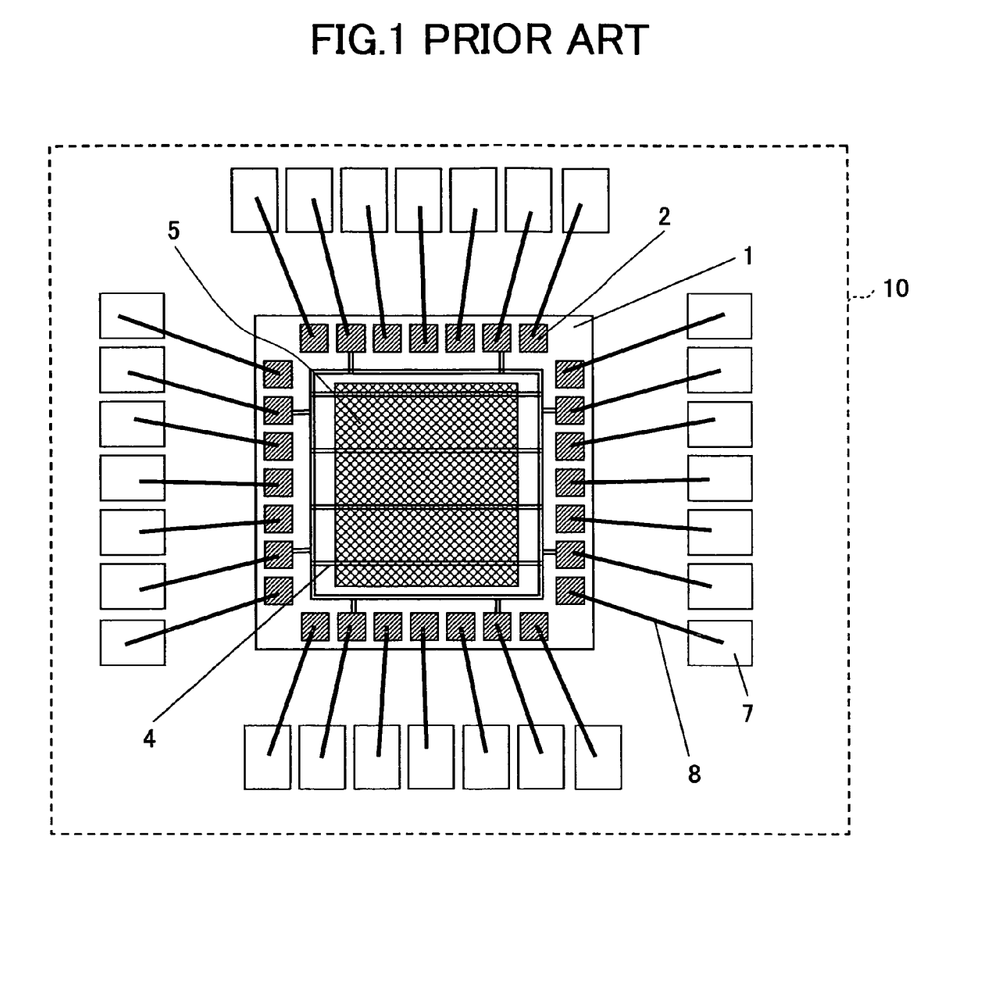
FIG. 1 is a diagram showing the composition of the conventional semiconductor device.

FIG. 1 shows the composition of the conventional semiconductor device 10. The semiconductor chip 1, such as LSI, is carried on the interposer used as the substrate indicated by the dotted line in FIG. 1. The semiconductor chip 1 comprises the core part 5 which forms the circuit part, the plurality of electrode pads 2 disposed at the peripheral part of the core part 5, and the power-supply line 4.

The electrode pad 2 disposed for the power supply, among the plurality of electrode pads 2, is connected by the circuit part and the power-supply line 4 of the semiconductor chip 1. The electrode pad 2 disposed for the grounding, among the plurality of electrode pads 2, is connected by the circuit part and the power-supply line 4 of the semiconductor chip 1.

The power supply current from the power supply (not illustrated) is supplied at the time of operation to the circuit of the core part 5 in the center of the semiconductor chip 1 through the power-supply line 4 from the periphery of the semiconductor chip 1.

On the substrate of the semiconductor device 1, the plurality of bonding leads 7 are disposed in the region encircling the semiconductor chip 1. Among the plurality of bonding leads 7, the bonding lead 7 for the power supply is connected to the power supply (not illustrated), and the bonding lead 7 for the grounding among the plurality of bonding leads 7 is grounded. All the bonding leads 7 provided on the substrate are electrically bonded to the electrode pads 2 at the periphery of the semiconductor chip 1 by the wires 8.

As the known method concerning the power supply wiring of the semiconductor device, Japanese Laid-Open Patent Application No. 03-008360 discloses the power supply wiring provided in the semiconductor device having the plurality of wiring layers. This semiconductor device has the wiring structure in which the plurality of semiconductor chips and the power supply wiring are connected via the through holes.

Moreover, Japanese Laid-Open Patent Application No. 64-089447 discloses the semiconductor integrated circuit device having the multilayer interconnection structure. In order to avoid the influence from the electric field and the magnetic field on the exterior of the integrated circuit, the semiconductor circuit device is configured to have the wiring structure in which at least one conductor layer among the plurality of conductor layers is connected to the power supply or the ground so as to cover entirely the periphery of the element (transistor) on the substrate.

In the conventional semiconductor device 10 of FIG. 1, the power supply current is supplied to the core part 5 of the semiconductor chip 1 via the power-supply line 4 at the time of operation. However, there is a tendency that the supply voltage in the center of the core part 5 falls to be lower than the supply voltage at the peripheral part of the core part 5.

Especially, at the time of high-speed operation, the power supply current is consumed with the passive component parts, such as resistors and inductors, and the supply voltage in the center of the core part 5 will be lower than the supply voltage in the peripheral part of the core part 5. There may arise the problem in which the predetermined operation cannot be performed by the circuit part of the semiconductor chip 1 due to the supply voltage drop. Therefore, in the case of the conventional semiconductor device 10, the supply voltage drop becomes the cause of the operational fault of the semiconductor chip 1.

SUMMARY OF THE INVENTION

An object of the present invention is to provide an improved semiconductor device in which the above-mentioned problems are eliminated.

Another object of the present invention is to provide a simple and low-cost semiconductor device in which the structure of the power-supply line is improved and the operation of the semiconductor chip can be stabilized effectively.

In order to achieve the above-mentioned objects, the present invention provides a semiconductor device in which the openings are respectively formed on the power-supply line in the center of the circuit part of the semiconductor chip and the power-supply line at the peripheral part of the circuit part of the semiconductor chip. And the power-supply line on the opening of the center of the circuit part and the power-supply line on the opening of the peripheral part of the circuit part are mutually connected by the conductor layer formed from the silver paste etc. It is possible to make the power supply current supplied in the center of the circuit part during the operation increase. Therefore, it is possible for the present invention to prevent that the supply voltage in the center of the circuit part falls during the operation, and the operation of the semiconductor chip can be stabilized effectively.

BRIEF DESCRIPTION OF THE DRAWINGS

Other objects, features and advantages of the present invention will be apparent from the following detailed description when read in conjunction with the accompanying drawings.

DETAILED DESCRIPTION OF PREFERRED EMBODIMENTS

A description will now be given of the preferred embodiments of the present invention with reference to the accompanying drawings.

Figure 4:
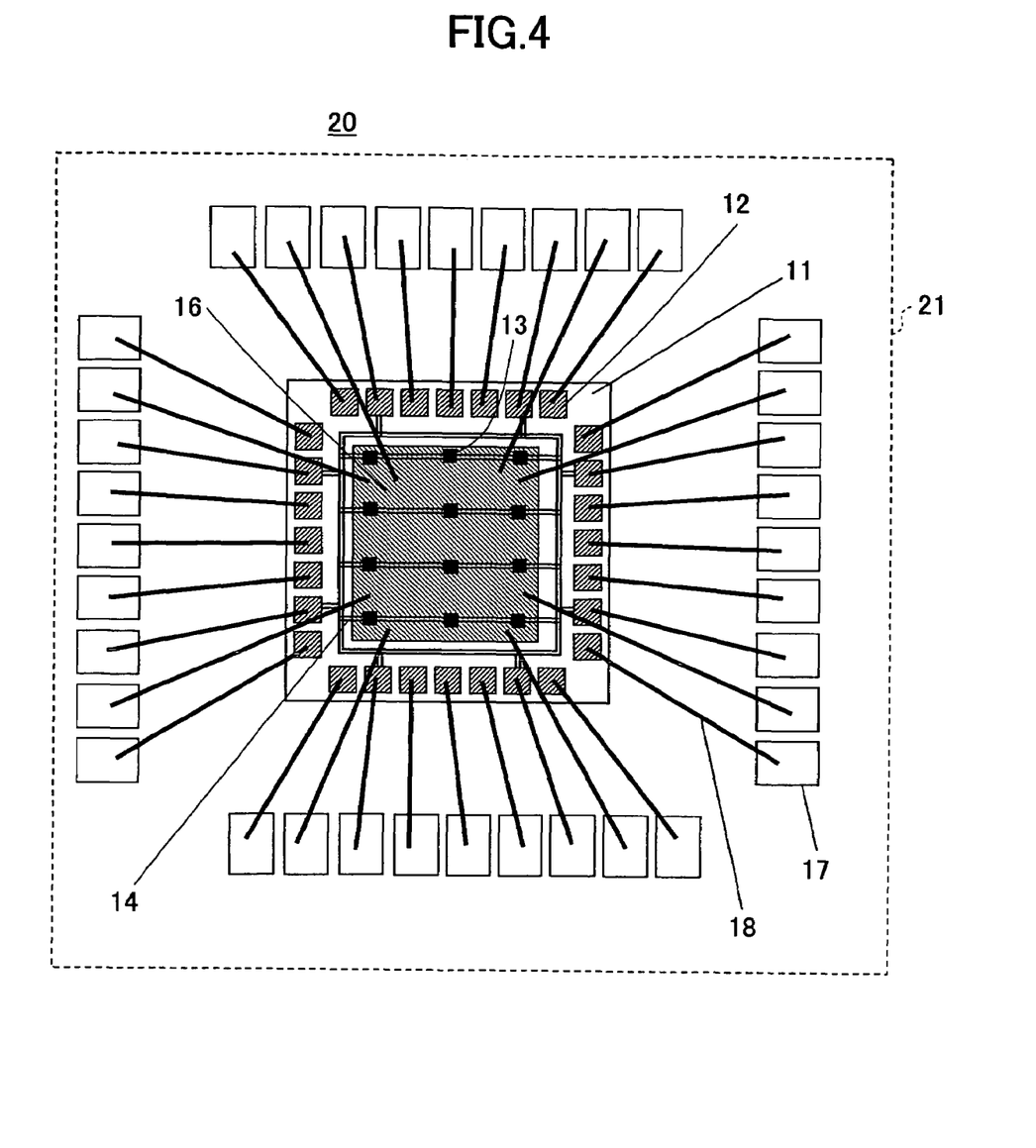
FIG. 4 is a diagram showing the composition of the semiconductor device in one embodiment of the present invention.
Figure 10:
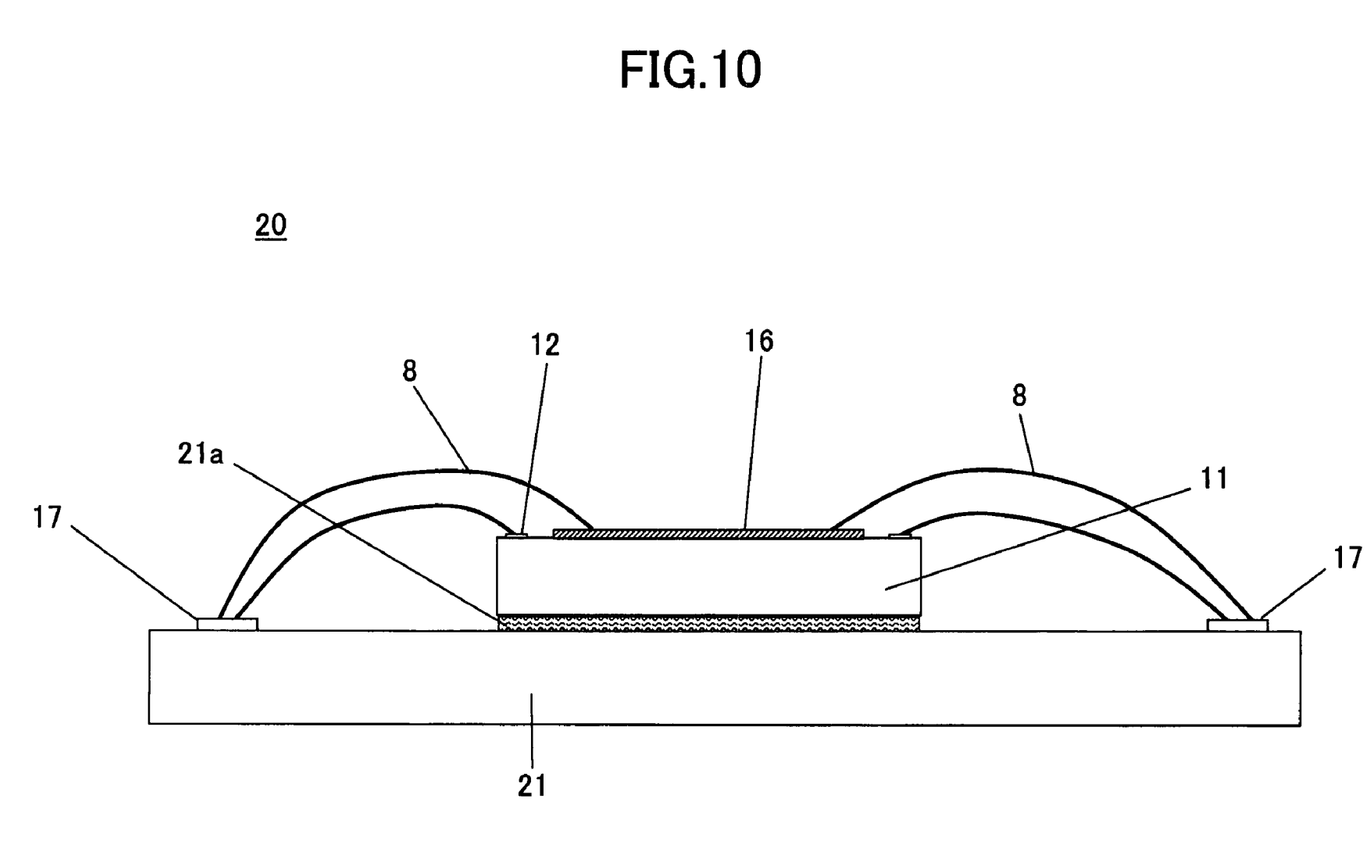
FIG. 10 is a side view showing the connection between the wiring board, the semiconductor chip and the conductor layer in the semiconductor device of FIG. 4.

FIG. 4 shows the composition of the semiconductor device in one preferred embodiment of the present invention. FIG. 10 shows the connection between the wiring board, the semiconductor chip and the conductor layer in the semiconductor device of FIG. 4.

The semiconductor device 20 of FIG. 4 comprises the semiconductor chip 11 carried on the wiring board 21, such as LSI. The wiring board 21 is used as the interposer, for example. The semiconductor chip 11 contains the circuit part (core part) formed in the center, the plurality of electrode pads 12 disposed at the peripheral part of the circuit part, and the power-supply line 14.

As shown in FIG. 10, the semiconductor chip 11 is mounted on the wiring board 21 via the die material 21a with its circuit part formed on the front surface being placed up side and its back surface being placed down side. The electrode pad 12 disposed for the power supply among the plurality of electrode pads 12 is connected with the circuit part and the power-supply line 14 of the semiconductor chip 11.

The electrode pad 12 disposed for the grounding among the plurality of electrode pads 12 is connected with the circuit part and the power-supply line 14 of the semiconductor chip 11. The power supply current from the power supply (not illustrated) is supplied at the time of operation from the peripheral part of the semiconductor chip 11 to the circuit part in the center of the semiconductor chip through the power-supply line 14.

On the wiring board 21 of the semiconductor device 20, the plurality of bonding leads 17 are disposed in the region encircling the semiconductor chip 11. Among the plurality of bonding leads 17, the bonding lead 17 for the power supply is connected with the power supply (not illustrated), and the bonding lead 17 for the grounding among the plurality of bonding leads 17 is grounded.

Each electrode pad 12 at the periphery of the semiconductor chip 11 is electrically connected to one of the plurality of bonding leads 17 by a wire 18, respectively.

In order to solve the problem in which the supply voltage supplied in the center of the circuit part of the semiconductor chip falls at the time of operation of the conventional semiconductor device mentioned above, the semiconductor device 20 of FIG. 4 is configured as in the following. The opening 13 is formed on each of the power-supply lines 14 in the center and at the peripheral part of the circuit part of the semiconductor chip 11, respectively. The conductor layer 16 is formed on these openings 13 to cover the whole surface of the circuit part of the semiconductor chip 11, and the power-supply line 14 on the opening 13 of the center of the circuit part and the power-supply line 14 on the opening 13 of the peripheral part of the circuit part are mutually connected by the conductor layer 16.

This conductor layer 16 can be formed by applying the conductive material, such as a silver paste, to the semiconductor chip 11. The bonding leads 17 for the conductor layer, among the plurality of bonding leads 17 on the wiring board 21 of the semiconductor device 20, are electrically connected to the conductor layer 16 by the wires 18. These bonding leads 17 for the conductor layer (in the example of FIG. 4, eight pieces) include the bonding lead connected to the power supply (not illustrated), and the bonding lead connected to the ground.

Therefore, at the time of operation, the power supply current from the power supply (not illustrated) is directly supplied to the conductor layer 16 through the bonding leads 17 for the conductor layer and the wires 18. By forming this conductor layer 16 in the semiconductor device of the present invention, it is possible to increase the amount of the power supply current supplied to the circuit part in the center of the semiconductor chip 11 at the time of operation.

Therefore, in the time of operation, it is possible to prevent the falling of the supply voltage in the center of the circuit part of the semiconductor chip 11, and the operation of the semiconductor ship 11 can be stabilized effectively.

Figure 2A:
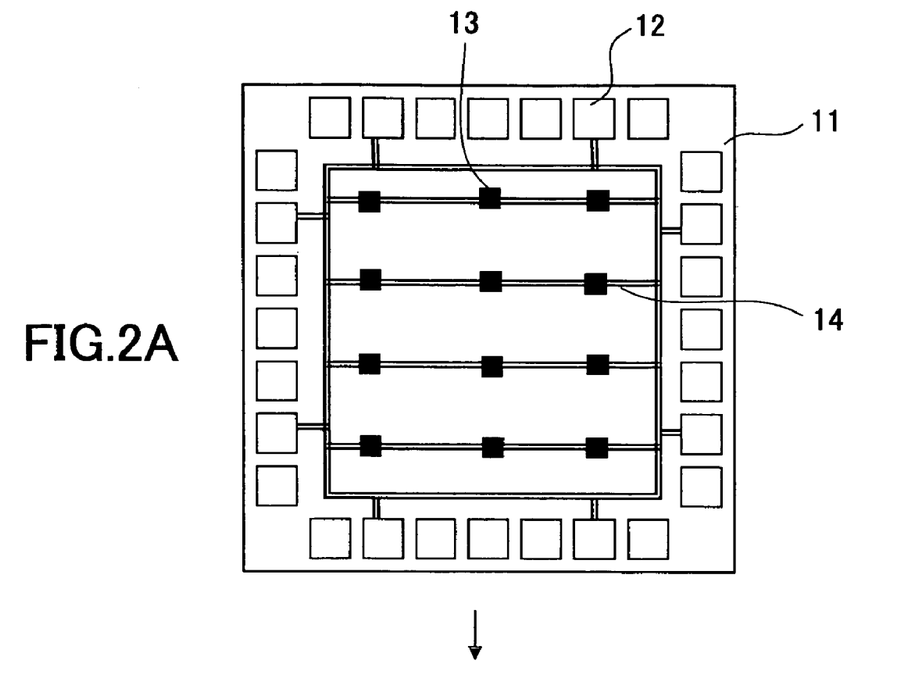
FIG. 2A is a diagram for explaining the conductor layer formed on the power-supply line of the circuit part of the semiconductor chip in the preferred embodiment of the present invention.
Figure 2B:
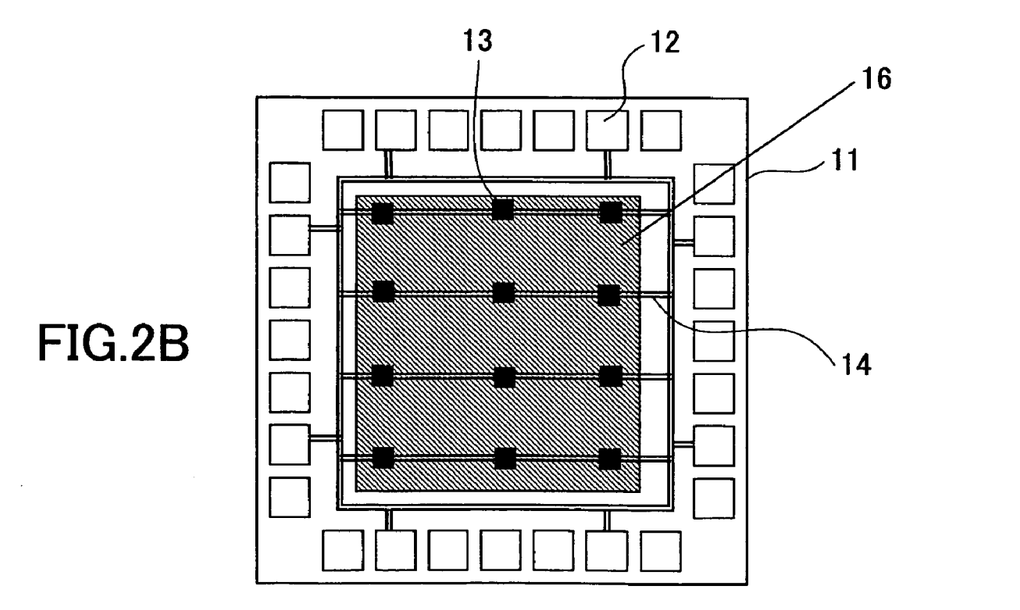
FIG. 2B is a diagram for explaining the conductor layer formed on the power-supply line of the circuit part of the semiconductor chip in the preferred embodiment of the present invention.

FIG. 2A and FIG. 2B are diagrams for explaining the conductor layer 16 formed on the power-supply line 14 of the circuit part of the semiconductor chip 11 of FIG. 4.

Before forming the conductor layer 16, the plurality of openings 13 are formed on the power-supply line 14 of the semiconductor chip 11 as shown in FIG. 2A. The positions where the plurality of openings 13 are formed are distributed equally for the positions on the power-supply line 14 near the peripheral part of the circuit part of the semiconductor chip 11, and the positions on the power-supply line 14 near the center of the circuit part of the semiconductor chip 11 in which the voltage drop tends to arise.

In each of the plurality of openings 13, the opening is formed such that other wiring layers, insulating layers, etc. may not close a part of the power-supply line 14 of the semiconductor chip 11. These openings 13 can be formed additionally within the manufacturing processes of the semiconductor chip 11. Alternatively, these openings 13 may be formed after the manufacture of the semiconductor chip 11.

As shown in FIG. 2B, after the plurality of openings 13 are formed, the conductor layer 16 is formed thereon. By applying or printing the conductive substance, such as a silver paste, the conductor layer 16 is formed to cover all the plurality of openings 13 on the semiconductor chip 11, and the conductor layer 16 and the power-supply line 14 are connected together at each opening 13.

Figure 9:
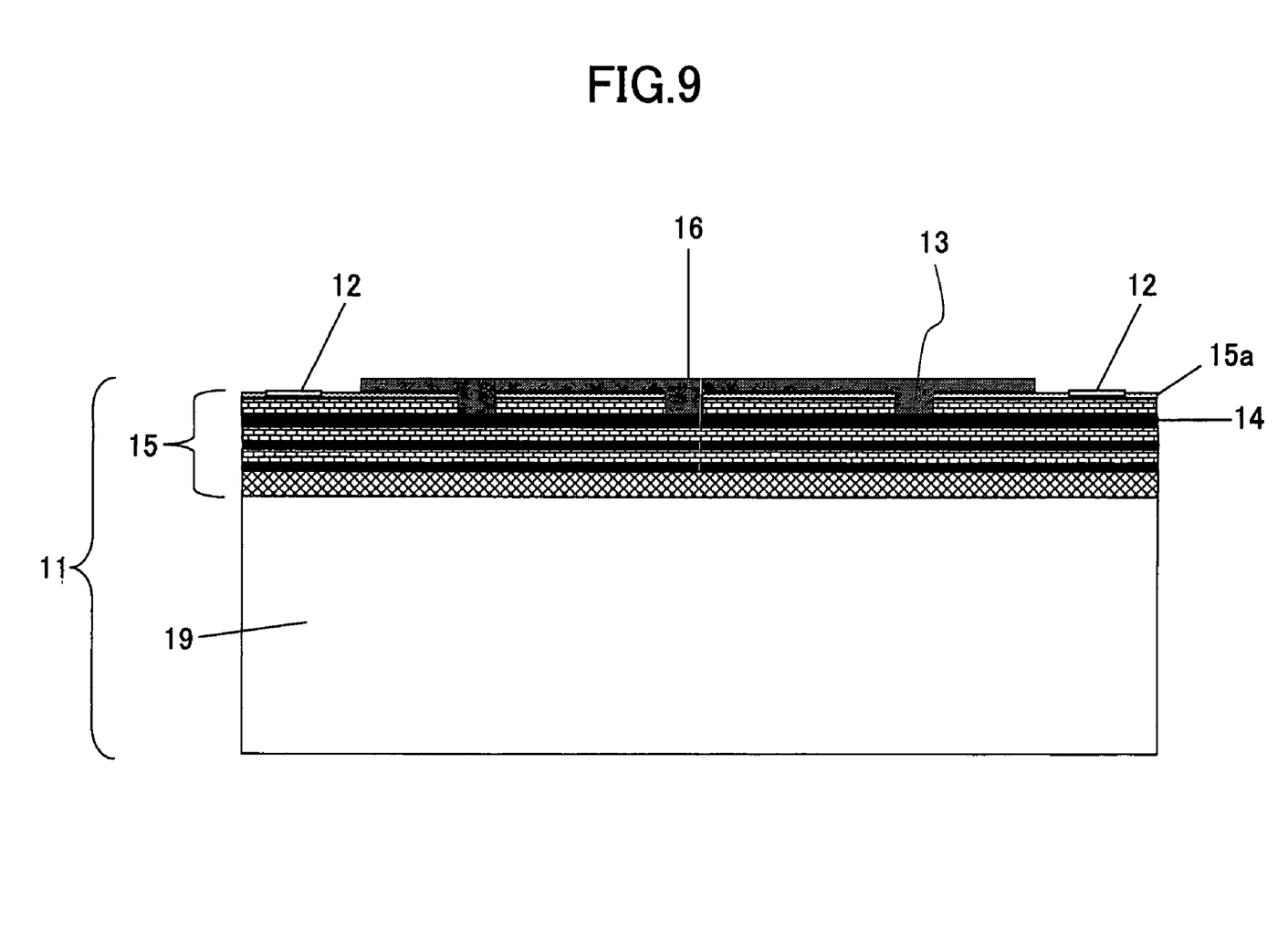
FIG. 9 is a cross-sectional view showing the cross-sectional structure of the semiconductor chip of FIG. 2B.

FIG. 9 shows the cross-sectional structure of the semiconductor chip 11 of FIG. 2B.

As shown in FIG. 9, the semiconductor chip 11 comprises the substrate 19, such as silicon, the wiring layer 15 formed on the substrate 19, the conductor layer 16 formed on the wiring layer 15, and the electrode pads 12. The wiring layer 15 includes the insulating layer 15a, the power-supply line 14, and other wiring layers.

The opening 13 is formed by removing the insulating layer 15a of the wiring layer 15, so that the power-supply line 14 is exposed. The conductor layer 16 is formed by applying or printing the silver paste or the like, so that all the openings 13 on the semiconductor chip 11 are covered by the conductor layer 16.

In this embodiment, the silver (Ag) content of the silver paste used is 60% or more, the silver paste is heated and hardened, and the silver content of the hardened material is 99% or more. It is a matter of course that the metal, such as gold (Au) or copper (Cu), and other conductive substances, other than silver (Ag), may be used as the material for forming the conductor layer 16.

Figure 3:
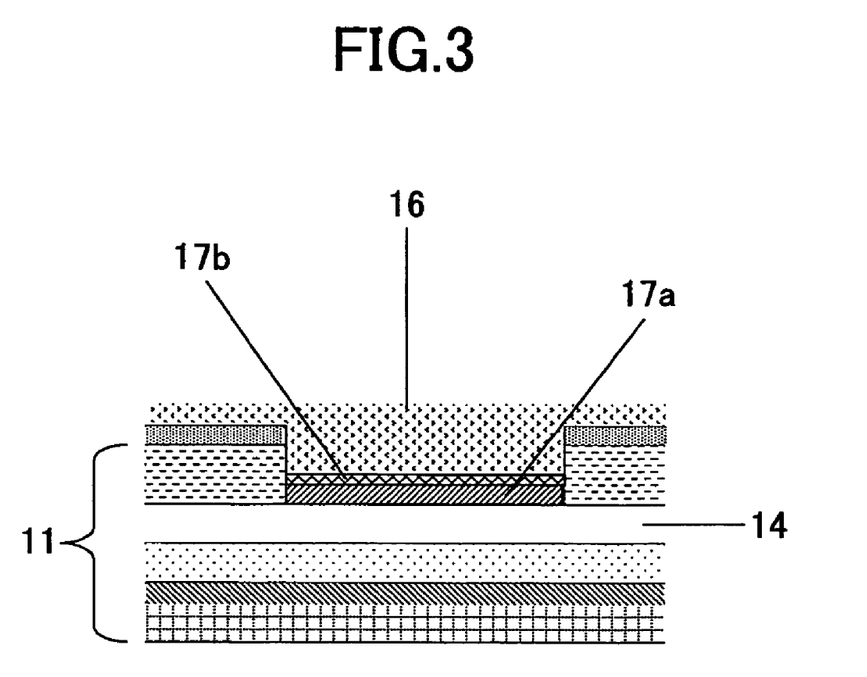
FIG. 3 is a cross-sectional view showing the connection between the power-supply line and the conductor layer in the semiconductor chip of FIG. 2B.

FIG. 3 shows the connection between the power-supply line 14 and the conductor layer 16 in the opening 13 of the semiconductor chip 11 of FIG. 2B.

The wiring of the semiconductor chip 11 of FIG. 2B is formed with aluminum (Al) or copper (Cu) and the wiring width of the power-supply line 14 is comparatively small (about ten micrometers). For this reason, before the silver paste is applied, the non-electrolytic plating is performed so that the plating of nickel (Ni) and gold (Au) is formed on the power-supply line 14 at the position of the opening 13, in order to avoid the disconnection of the wiring by the thermal stress at the time of hardening of the silver paste.

As shown in FIG. 3, in the opening 13 disposed in the circuit part of the semiconductor chip 11, the nickel plating layer 17a and the Au plating layer 17b are formed on the power-supply line 14, and the conductor layer 16 is further formed on the plating layers 17a and 17b by applying and hardening of the silver paste, so that the conductive layer 16 covers almost the whole surface of the circuit part of the semiconductor chip 11 including the center and the peripheral part thereof.

In the semiconductor device 20 having the above-described structure, the opening 13 disposed in the center of the circuit part of the semiconductor chip 11 and the openings 13 disposed at the peripheral part of the circuit part of the semiconductor chip 11 are connected with each other by the conductor layer 16, and the conductor layer 16 is electrically connected with the power-supply line 14 at each of these openings 13.

As explained above, in the semiconductor device 20 of FIG. 4, by forming the openings 13 and the conductor layer 16 in the circuit part of the semiconductor chip 11, it is possible to increase the power supply current supplied to the circuit part in the center of the semiconductor chip 11 at the time of operation. Therefore, it is possible to prevent the falling of the supply voltage in the center of the circuit part of the semiconductor chip 11 at the time of operation, and the operation of the semiconductor chip 11 can be stabilized effectively.

In addition, the openings 13 and the conductor layer 16 in this embodiment can be easily formed on the semiconductor chip 11 by using the known wiring method, and it is possible for the present invention to provide a simple and low-cost semiconductor device.

Next, the semiconductor device in another embodiment of the present invention will be explained using FIG. 5 and FIG. 6.

As for the chip mounting technology which mounts the IC or LSI chip, the wire bonding method, the flip-chip bonding method, the TAB (Tape Automated Bonding) method, etc. are known. And these methods are properly used depending on the device or product field concerned.

The above-described semiconductor device 20 of FIG. 4 is one embodiment of the invention in which the mounting of the semiconductor chip is performed by using the wire bonding method.

Figure 5:
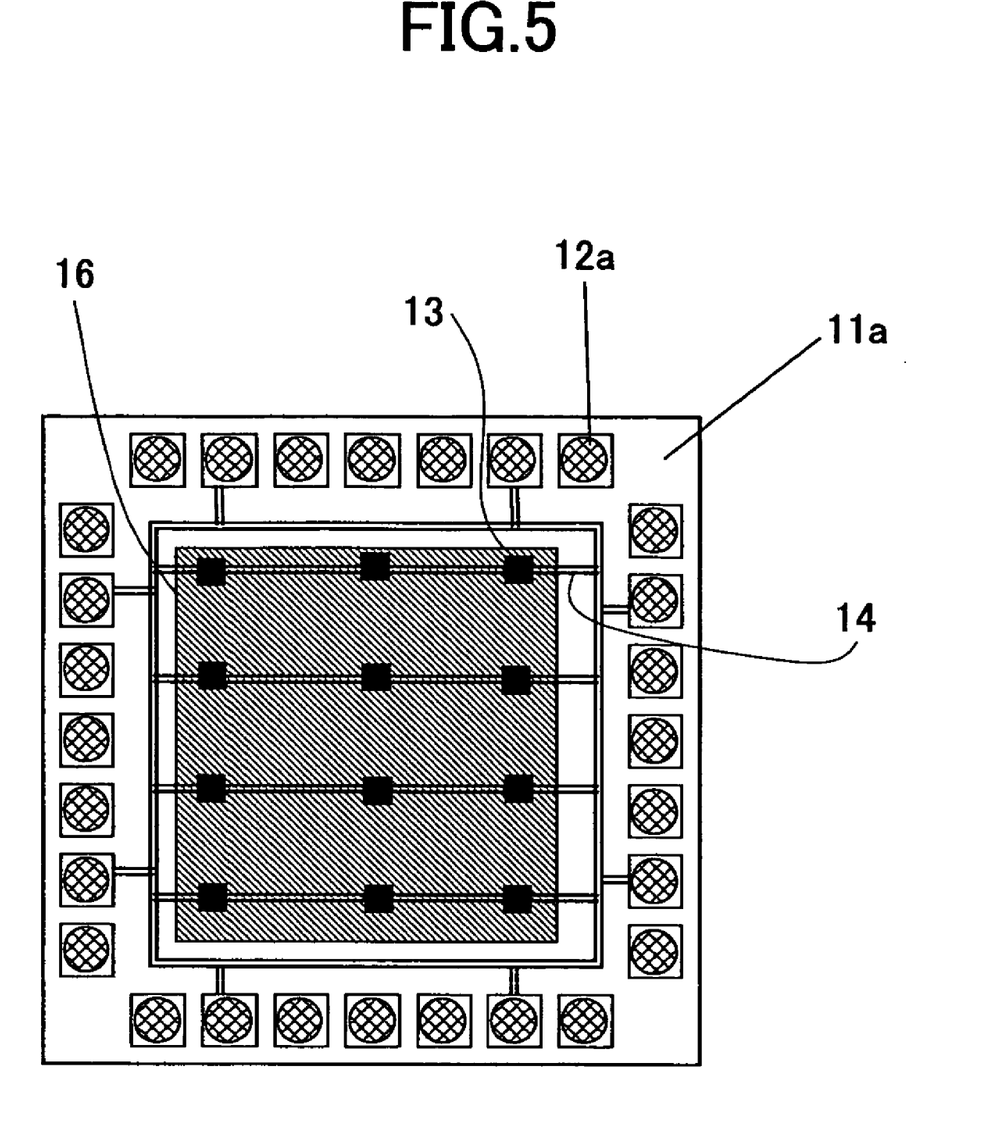
FIG. 5 is a diagram showing the composition of the semiconductor device in another embodiment of the present invention.
Figure 6:
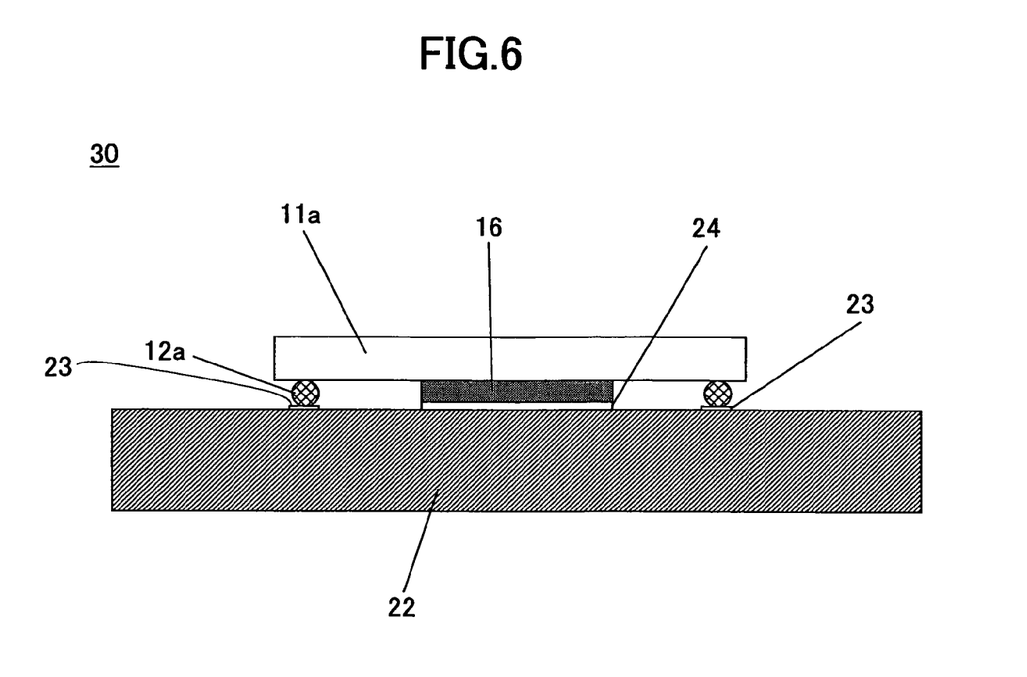
FIG. 6 is a cross-sectional view showing the connection between the substrate, the semiconductor chip and the conductor layer in the semiconductor device of FIG. 5.

In contrast, the semiconductor device 30 shown in FIG. 5 and FIG. 6 is one embodiment of the invention in which the mounting of the semiconductor chip is performed by using the flip-chip bonding method.

FIG. 5 shows the composition of the circuit formation surface (back surface) of the semiconductor chip 11a in this embodiment. FIG. 6 shows the connection between the substrate 22, the semiconductor chip 11a, and the conductor layer 16 in the semiconductor device 30 of this embodiment.

The semiconductor device 30 of this embodiment comprises the semiconductor chip 11a carried on the substrate 22, such as LSI. Unlike the semiconductor chip 11 of FIG. 2B in which the plurality of electrode pads 12 are disposed, the plurality of bumps 12a are disposed at the peripheral part of the semiconductor chip 11a in this embodiment, instead of the plurality of electrode pads 12, as shown in FIG. 5.

As shown in FIG. 5, the semiconductor chip 11a comprises the circuit part (core part) formed in the center, the plurality of bumps 12a disposed at the peripheral part of the circuit part, the power-supply line 14, the plurality of openings 13, and the conductor layer 16. The bump 12a disposed for the power supply, among the plurality of bumps 12a, is connected with the circuit part and the power-supply line 14 of the semiconductor chip 11a. The bump 12a disposed for the grounding, among the plurality of bumps 12a, is connected with the circuit part and the power-supply line 14 of the semiconductor chip 11a.

The power supply current from the power supply (not illustrated) is supplied at the time of operation from the peripheral part of the semiconductor chip 11a to the circuit part in the center of the semiconductor chip 11a through the power-supply line 14.

The openings 13 are formed respectively on the power-supply line 14 disposed in the center of the circuit part of the semiconductor chip 11a and on the power-supply line 14 at the peripheral part of the circuit part of the semiconductor chip 11a. The conductor layer 16 is formed on these openings 13 to cover the whole surface of the circuit part of the semiconductor chip 11a, and the power-supply line 14 on the opening 13 of the center of the circuit part and the power-supply line 14 on the opening 13 of the peripheral part of the circuit part are connected with each other by the conductor layer 16.

Similar to the formation method mentioned above using FIG. 2B, the conductor layer 16 can be formed by applying and hardening the conductive material, such as a silver paste, to the semiconductor chip 11a. In the following, the overlapping explanation will be omitted.

As shown in FIG. 6, the terminal 24 is disposed on the substrate 22 of the semiconductor device 30 in the region confronting the circuit part of the semiconductor chip 11a, and the plurality of terminals 23 are disposed on the substrate 22 in the region confronting the plurality of bumps 12a of the semiconductor chip 11a.

Among the plurality of terminals 23, the terminal 23 for the power supply is connected with the power supply (not illustrated), and the terminal 23 for the grounding among the plurality of terminals 23 is grounded.

In the semiconductor device 30 of FIG. 6, each of the plurality of bumps 12a at the periphery of the semiconductor chip 11a is electrically connected to one of the plurality of terminals 23 disposed on the substrate 22, respectively. The conductor layer 16 in the center of the semiconductor chip 11a is also electrically connected to the terminal 24 disposed on the substrate 22.

Similar to the previous embodiment of FIG. 4, in the semiconductor device 30 of this embodiment, by forming the openings 13 and the conductor layer 16 in the circuit part of the semiconductor chip 11a, it is possible to increase the power supply current supplied to the circuit part in the center of the semiconductor chip 11a at the time of operation. Therefore, it is possible to prevent the falling of the supply voltage in the center of the circuit part of the semiconductor chip 11a at the time of operation, and the operation of the semiconductor chip 11a can be stabilized effectively.

Since the openings 13 and the conductor layer 16 in this embodiment can also be easily formed on the semiconductor chip 11a by using the known wiring method, it is possible for the present invention to provide a simple and low-cost semiconductor device.

Next, the semiconductor device in another embodiment of the present invention will be explained using FIG. 7 and FIG. 8.

As mentioned above, the semiconductor device 20 of FIG. 4 is one embodiment of the invention in which the mounting of the semiconductor chip is performed by using the wire bonding method. In contrast, the semiconductor device 40 shown in FIG. 7 and FIG. 8 is one embodiment of the invention in which the mounting of the semiconductor chip is performed by using the TAB method.

Figure 7:
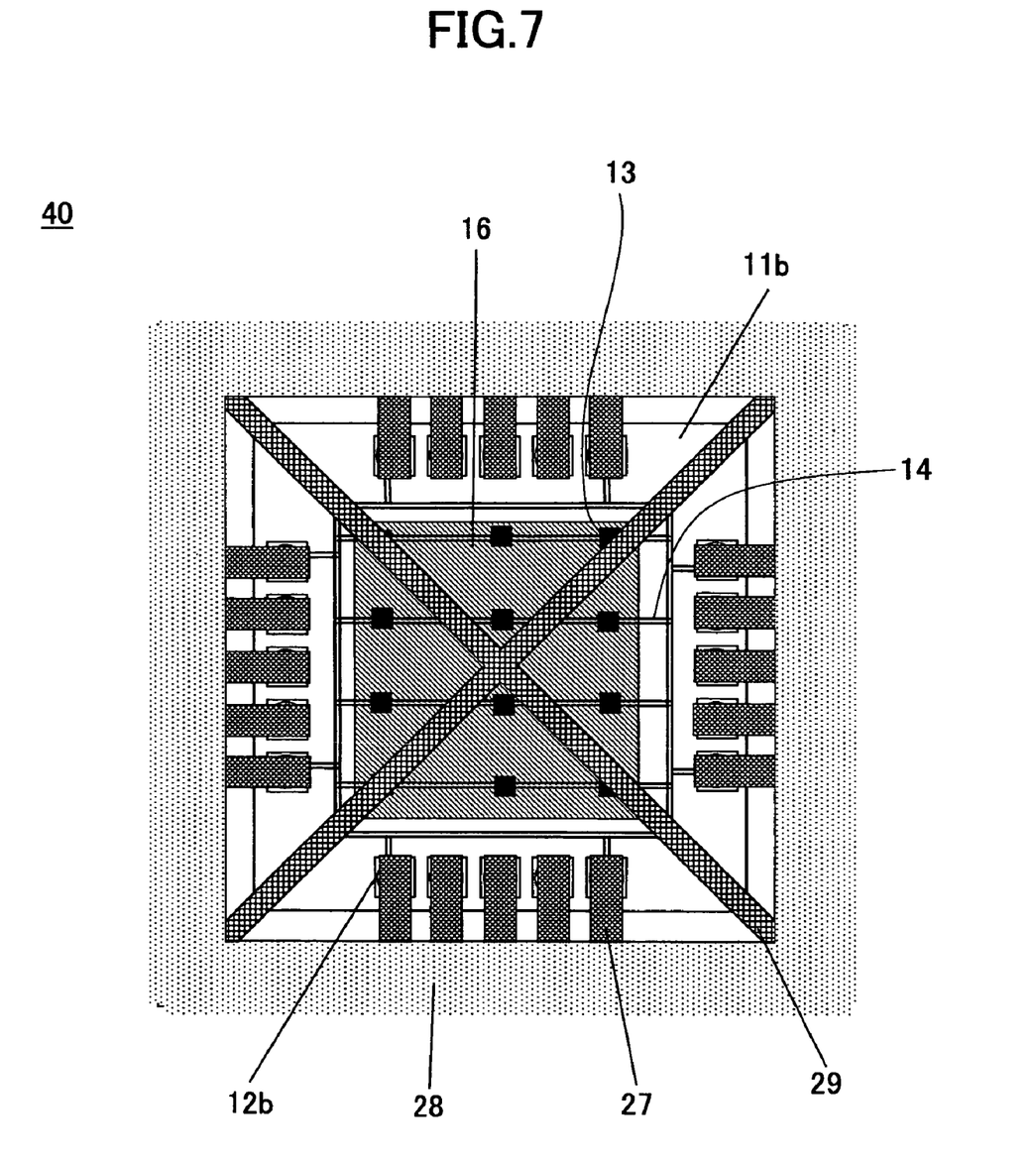
FIG. 7 is a diagram showing the composition of the semiconductor device in another embodiment of the present invention.

FIG. 7 shows the composition of the circuit formation surface (front surface) of the semiconductor chip 11b of this embodiment and the TAB tape 28. FIG. 8 shows the connection between the TAB tape 28, the semiconductor chip 11b and the conductor layer 16 in the semiconductor device 40 of this embodiment.

The semiconductor device 40 of this embodiment comprises the semiconductor chip 11b carried on the TAB tape 28. Unlike the example of FIG. 2B, the plurality of bumps 12b are disposed at the peripheral part of the semiconductor chip 11b as shown in FIG. 7, instead of the plurality of electrode pads 12.

As shown in FIG. 7, the semiconductor chip 11b comprises the circuit part (core part) formed in the center, the plurality of bumps 12b disposed at the peripheral part of the circuit part, the power-supply line 14, the plurality of openings 13, and the conductor layer 16.

The bump 12b disposed for the power supply, among the plurality of bumps 12b, is connected with the circuit part and the power-supply line 14 of the semiconductor chip 11b. The bump 12b disposed for the grounding, among the plurality of bumps 12b, is connected with the circuit part and the power-supply line 14 of the semiconductor chip 11b.

The power supply current from the power supply (not illustrated) is supplied, at the time of operation, from the peripheral part of the semiconductor chip 11b to the central circuit part through the power-supply line 14.

The openings 13 are formed respectively on the power-supply line 14 disposed in the center of the circuit part of the semiconductor chip 11a and on the power-supply line disposed at the peripheral part of the circuit part of the semiconductor chip 11b. The conductor layer 16 is formed on these openings 13 to cover the whole surface of the circuit part of the semiconductor chip 11b, and the power-supply line 14 on the opening 13 of the center of the circuit part and the power-supply line 14 on the opening 13 of the peripheral part of the circuit part are connected with each other by the conductor layer 16.

Similar to the formation method mentioned above using FIG. 2B, the conductor layer 16 can be formed by applying and hardening the conductive material, such as a silver paste, to the semiconductor chip 11b. In the following, the overlapping explanation will be omitted.

In the TAB tape 28, the plurality of leads 27 are disposed at the positions confronting the plurality of bumps 12b of the semiconductor chip 11b respectively. The lead 27 for the power supply, among the plurality of leads 27, is connected with the power supply (not illustrated), and the lead 27 for the grounding among the plurality of leads 27 is grounded. Furthermore, a pair of leads 29 for the power supply which are arranged in the X-shaped formation are disposed in the opening of the TAB tape 28 at the position confronting the circuit part of the semiconductor chip 11b.

Figure 8:
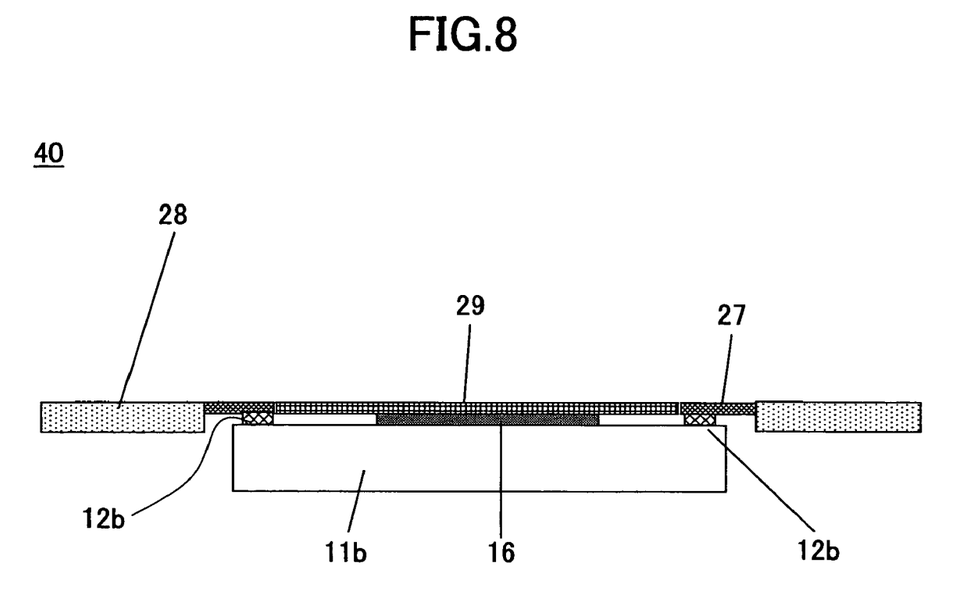
FIG. 8 is a cross-sectional view showing the connection between the TAB tape, the semiconductor chip and the conductor layer in the semiconductor device of FIG. 7.

As shown in FIG. 8, in semiconductor device 40 of this embodiment, each of the plurality of bumps 12b at the periphery of the semiconductor chip 11b is electrically connected to one of the plurality of leads 27 disposed on the TAB tape 28, respectively. And the conductor layer 16 in the center of the semiconductor chip 11b is also electrically connected to the lead 29 for the power supply formed on the TAB tape 28.

Similar to the previous embodiment of FIG. 4, in the semiconductor device 40 of this embodiment, by forming the openings 13 and the conductor layer 16 in the circuit part of the semiconductor chip 11b, it is possible to increase the power supply current supplied to the center of the circuit part of the semiconductor chip 11b at the time of operation. Therefore, it is possible to prevent the falling of the supply voltage in the center of the circuit part of the semiconductor chip 11b during the operation, and the operation of the semiconductor chip 11b can be stabilized effectively. Since the openings 13 and the conductor layer 16 in this embodiment can also be easily formed on the semiconductor chip 11b by using the known wiring method, it is possible for the present invention to provide a simple and low-cost semiconductor device.

The present invention is not limited to the above-described embodiments, and variations and modifications may be made without departing from the scope of the present invention.

What is claimed is:

1. A semiconductor device comprising:
   a semiconductor chip in which a circuit part provided in a center of the semiconductor chip is connected with power-supply lines and power-supply electrodes to supply power from an external power source to the circuit part;
   a substrate provided for carrying the semiconductor chip thereon and provided so that first terminals disposed in a region encircling the semiconductor chip are electrically connected to the power-supply electrodes;
   a first opening formed on the power-supply line in a center of the circuit part;
   a second opening formed on the power-supply line at a peripheral part of the circuit part; and
   a conductor layer electrically connected to second terminals disposed in the region encircling the semiconductor chip on the substrate, and provided so that the power-supply line in the first opening and the power-supply line in the second opening are connected to each other by the conductor layer.

2. A semiconductor device according to claim 1 wherein the conductor layer is formed using any conductive substance from among silver, gold, and copper.

3. A semiconductor device according to claim 1 wherein the power supply line in the first opening and the power supply line in the second opening are connected with the conductor layer via a metal plating layer.

4. A semiconductor device comprising:
a semiconductor chip in which a circuit part provided in a center of the semiconductor chip is connected with power-supply lines and power-supply bumps to supply power from an external power source to the circuit part;
a substrate provided for carrying the semiconductor chip thereon and provided so that first terminals disposed in a region confronting the power-supply bumps on the semiconductor chip are electrically connected to the power-supply bumps;
a first opening formed on the power-supply line in a center of the circuit part;
a second opening formed on the power-supply line at a peripheral part of the circuit part;
a conductor layer electrically connected to second terminals disposed in the region confronting the circuit part on the substrate, and provided so that the power-supply line in the first opening and the power-supply line in the second opening are connected to each other by the conductor layer.

5. A semiconductor device according to claim 4 wherein the conductor layer is formed using any conductive substance from among silver, gold, and copper.

6. A semiconductor device according to claim 4 wherein the power supply line in the first opening and the power supply line in the second opening are connected with the conductor layer via a metal plating layer.

7. A semiconductor device comprising:
a semiconductor chip in which a circuit part provided in a center of the semiconductor chip is connected with power-supply bumps and power-supply lines to supply power from an external power source to the circuit part;
a TAB tape provided for carrying the semiconductor chip thereon and provided so that first leads disposed in a region encircling the semiconductor chip are electrically connected to the power-supply bumps;
a first opening formed on the power-supply line in a center of the circuit part;
a second opening formed on the power-supply line at a peripheral part of the circuit part; and
a conductor layer electrically connected to second leads disposed in the region confronting the semiconductor chip on the TAB tape, and provided so that the power-supply line in the first opening and the power-supply line in the second opening are connected to each other by the conductor layer.

8. A semiconductor device according to claim 7 wherein the conductor layer is formed using any conductive substance from among silver, gold, and copper.

9. A semiconductor device according to claim 7 wherein the power supply line in the first opening and the power supply line in the second opening are connected with the conductor layer via a metal plating layer.

* * * * *